(12) United States Patent
Wang et al.

(10) Patent No.: US 8,465,906 B2
(45) Date of Patent: Jun. 18, 2013

(54) METHOD AND MASK FOR ENHANCING THE RESOLUTION OF PATTERNING 2-ROW HOLES

(75) Inventors: Chun-Ming Wang, Fremont, CA (US);
Chenche Huang, Campbell, CA (US);
Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 82 days.

(21) Appl. No.: 13/081,268

(22) Filed: Apr. 6, 2011

(65) Prior Publication Data

US 2012/0258387 A1 Oct. 11, 2012

(51) Int. Cl.
*G03F 7/20* (2006.01)
*G03F 7/36* (2006.01)

(52) U.S. Cl.
USPC ............................................ 430/311; 430/313

(58) Field of Classification Search
USPC .................................................. 430/311, 313
See application file for complete search history.

(56) References Cited

U.S. PATENT DOCUMENTS

| | | | |
|---|---|---|---|
| 7,005,350 B2 | 2/2006 | Walker et al. | |
| 7,023,739 B2 | 4/2006 | Chen et al. | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,745,265 B2 | 6/2010 | Mokhlesi et al. | |
| 7,746,680 B2 | 6/2010 | Scheuerlein et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 2002/0172872 A1* | 11/2002 | Hoshino | 430/5 |
| 2003/0077911 A1* | 4/2003 | Chang et al. | 438/725 |
| 2004/0124466 A1* | 7/2004 | Walker et al. | 257/344 |
| 2007/0252201 A1 | 11/2007 | Kito et al. | |
| 2008/0028359 A1 | 1/2008 | Blawid et al. | |
| 2008/0099835 A1 | 5/2008 | Kim | |
| 2008/0235650 A1 | 9/2008 | Ito et al. | |
| 2009/0168480 A1* | 7/2009 | Scheuerlein et al. | 365/51 |
| 2010/0330806 A1 | 12/2010 | Wang et al. | |

OTHER PUBLICATIONS

Invitation to Pay Additional Search Fees and Partial Search issued in PCT Application No. PCT/US2012/031423, mailed on Jul. 5, 2012.

(Continued)

*Primary Examiner* — Mark F Huff
*Assistant Examiner* — John S Ruggles
(74) *Attorney, Agent, or Firm* — The Marbury Law Group PPLC (57) ABSTRACT

A photolithography mask including a plurality of mask features. Adjacent mask features are separated by a gap and are offset from each other such that individual mask features have one-side dense portions and two-side dense portions. Also a photolithography method that includes a step of providing a substantially opaque mask having N stepped rows of offset, substantially transparent, rectangular mask features, where N is an integer and $N \geq 2$. The method also includes illuminating a photoresist layer located over an underlying material with dipole illumination through the substantially transparent, rectangular mask features in the substantially opaque mask to form 2N rows of exposed regions in the photoresist layer. The exposed regions have a substantially elliptical or substantially circular shape when viewed from above the photoresist layer.

10 Claims, 11 Drawing Sheets

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-shaped BiCS Flash Memory," 2009 Symposium on VLSI Technology Digest of Technical Papers, pp. 22-23.

U.S. Appl. No. 12/827,577, "Ultrahigh Density Vertical NAND Memory Device and Method of Making Thereof," filed Jun. 30, 2010.

U.S. Appl. No. 12/827,869, "Ultrahigh Density Vertical NAND Memory Device and Method of Making Thereof," filed Jun. 30, 2010.

U.S. Appl. No. 12/827,761, "Ultrahigh Density Vertical NAND Memory Device and Method of Making Thereof," filed Jun. 30, 2010.

U.S. Appl. No. 12/827,947, "Ultrahigh Density Vertical NAND Memory Device and Method of Making Thereof," filed Jun. 30, 2010.

International Search Report and Written Opinion issued in PCT Application No. PCT/US2012/031423, mailed on Nov. 9, 2012.

Nakamura H et al: "Low K1 Contact Hole Formation by Double Line and Space Formation Method With Contact Hole Mask and Dipole Illumination", Japanese Journal of Applied Physics, The Japan Society of Applied Physics, Japan Society of Applied Physics, Tokyo; JP, vol. 45, No. 6B, Jun. 1, 2006, pp. 5409-5417, XP001502448.

* cited by examiner

METHOD AND MASK FOR ENHANCING THE RESOLUTION OF PATTERNING 2-ROW HOLES

FIELD

The present invention is directed to photolithography masks and photolithographic patterning, and specifically to photolithographic patterning rows of holes.

BACKGROUND

Photolithography is a process used in semiconductor device microfabrication to selectively remove parts of a thin film or of the bulk substrate. The process uses radiation to transfer a geometric pattern from a photomask to a radiation-sensitive chemical photoresist or another radiation sensitive layer on the thin film or substrate. Typical radiation sources include optical, ultraviolet, x-ray and electron beam sources. Radiation sources commonly used in immersion lithography emit peak wavelengths at 193 nm. However, other wavelengths are possible.

To produce patterns with extremely small pitches in a photoresist, a phase shifting mask (PSM) may be used in conjunction with a dipole illumination. PSMs cause the shifting of the phase of a radiation source so that the peaks of one wave of radiation emitted by the radiation source lines up with the valleys of an adjacent wave (dipole illumination), effectively canceling each other out and producing a dual-beam image (a "shadow" image) between the waves that is smaller than the two waves themselves. The dual-beam image may be used to fabricate patterns having pitches as low as one-half the theoretical minimum pitch of the radiation source. In the PSM fabrication technique, radiation source beams are transmitted through zero degrees and 180 degrees and, when passing through the PSM mask, result in cancellation of the zero degree order of the radiation.

The highest resolution (smallest pitch size) currently achievable is produced using dipole illumination. Dipole illumination, however, is generally avoided when printing two dimensional ("2D") features, such as holes, because dipole illumination is asymmetric. That is, dipole illumination favors one direction. Thus, dipole illumination is most suitable for printing one dimensional ("1D") features.

It is very difficult to produce patterns with 2D features having a pitch less than 100 nm with conventional dipole illumination photolithographic techniques. It would therefore be advantageous to have a photolithographic technique suitable for patterning 2D features with the resolution of dipole illumination.

SUMMARY

An embodiment relates to a photolithography mask including a plurality of mask features. Adjacent mask features are separated by a gap and are offset from each other such that individual mask features have one-side dense portions and two-side dense portions.

Another embodiment relates to a photolithography method that includes a step of providing a substantially opaque mask having N stepped rows of offset, substantially transparent, rectangular mask features, where N is an integer and N≧2. The method also includes illuminating a photoresist layer located over an underlying material with dipole illumination through the substantially transparent, rectangular mask features in the substantially opaque mask to form 2N rows of exposed regions in the photoresist layer. The exposed regions have a substantially elliptical or substantially circular shape when viewed from above the photoresist layer.

Another embodiment, relates to a photolithography method. The method includes providing a mask having a plurality of mask features in which adjacent mask features are separated by a gap and are offset from each other such that individual mask features have one-side dense portions and two-side dense portions. The method also includes illuminating a photoresist layer located over an underlying material with dipole illumination through the plurality of mask features in the mask to form exposed regions in the photoresist layer.

DETAILED DESCRIPTION

As used herein, a "patterning feature" is a feature on a photolithography mask that is configured to produce one or more corresponding features in a photoresist layer. The corresponding feature(s) do not necessarily have the same shape as the patterning feature. Patterning feature may have a length and a width. If the length and width are different, the length denotes the longer of the two dimensions.

A "photoresist" may be defined as a radiation sensitive material used in the process of photolithography to form a patterned coating on a surface. Photoresists are typically categorized as either positive or negative. Positive photoresist regions become more sensitive to chemical etching when selectively exposed to radiation and the exposed portions are removed in the developing process. Negative photoresist regions, in contrast, become resistant to chemical etching when selectively exposed to radiation. When using negative photoresist, the unexposed areas of the photoresist are removed during the developing process.

Additionally, as used herein, a material that is "substantially opaque" is one that has a radiation transmission of less than 10% in a radiation wavelength or frequency of interest. Preferably, the radiation transmission is 5-6%. The substantially opaque materials as used herein may optionally have a 180 degree phase change angle. "Substantially transparent" material has a radiation transmission of greater than 75% in a radiation wavelength or frequency of interest. The substantially opaque material includes but is not limited to chromium or molybdenum silicide. The material which is substantially transparent includes but is not limited to glass or quartz.

Conventional masks and methods of photolithography are generally unsuitable for fabricating 2D features having a pitch less than 100 nm. Dipole illumination can be used to resolve 1D features having a pitch as small as 76 nm However, because of the asymmetry of dipole illumination, dipole illumination has been found to be unsuitable for fabrication of 2D features with a pitch less than 100 nm.

Figures 1A, 1B:
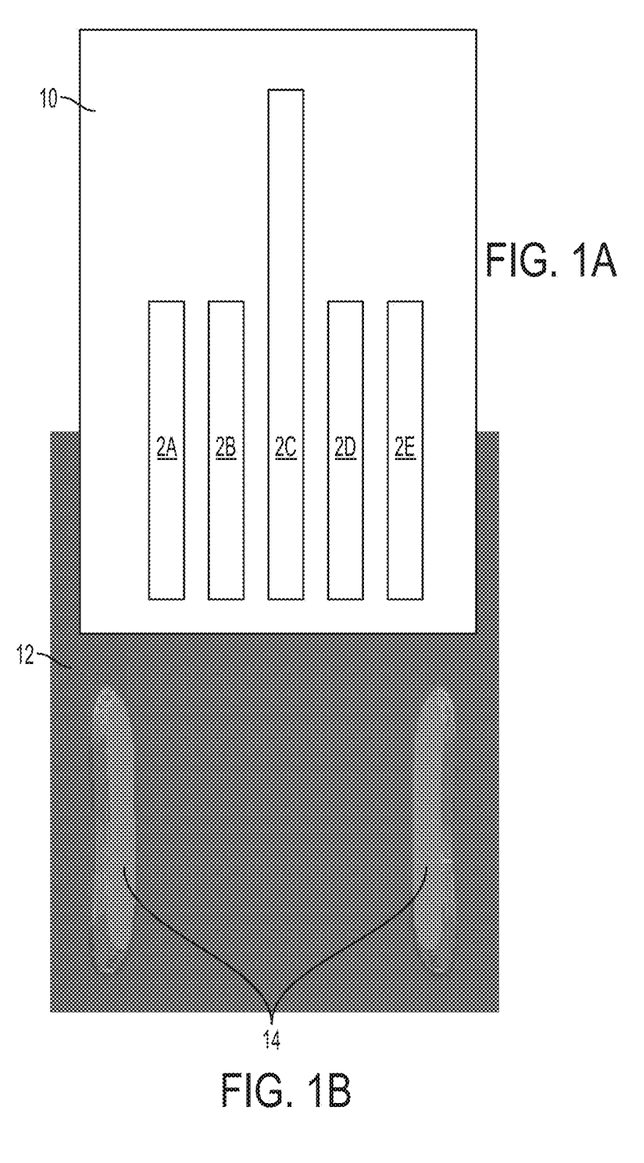
FIG. 1A illustrates a plan view of a mask design with five parallel bars and FIG. 1B illustrates the resulting exposure pattern showing the consequences of the optical proximity effect.

The inability of conventional photolithography methods to resolve 2D features having a pitch less than 100 nm is believed to be due to the diffraction/resolution limit FIGS. 1A and 1B illustrate the results of the optical proximity effect on the fabrication of sub 100 nm features. The photolithographic mask 10 includes mask features 2A-2E configured as substantially transparent parallel bars with a pitch of 76 nm in a substantially opaque mask. Absent the optical proximity effect, the five bar pattern would be reproduced in the underlying photoresist layer 12. The five bar pattern, however, is not reproduced.

The results of exposing the photoresist layer 12 through the mask 10 of FIG. 1A using dipole radiation are illustrated in FIG. 1B. As can be seen in FIG. 1B, the inner bars 2B-2D of mask 10 do not print in the underlying photoresist layer 12. That is, mask features 2B-2D that have adjacent mask features (e.g., 2A and 2C adjacent to 2B) closely located on two sides ("two-side dense") do not print in the underlying photoresist layer 12. "Closely located" as used in this application means less than 120 nm distant. In an embodiment, closely located may be less than 100 nm. Alternatively, closely located may be less than 80 nm, such as 10-75 nm.

Only photoresist features 14 corresponding to the two outer bars 2A, 2E of the mask 10 are reproduced in the photoresist layer 12. In contrast to the inner bars 2B-2D, the outer bars 2A, 2E only have a single closely located adjacent feature, (2B, 2D, respectively). That is, outer bars 2A, 2E are one-side dense.

Figure 2:
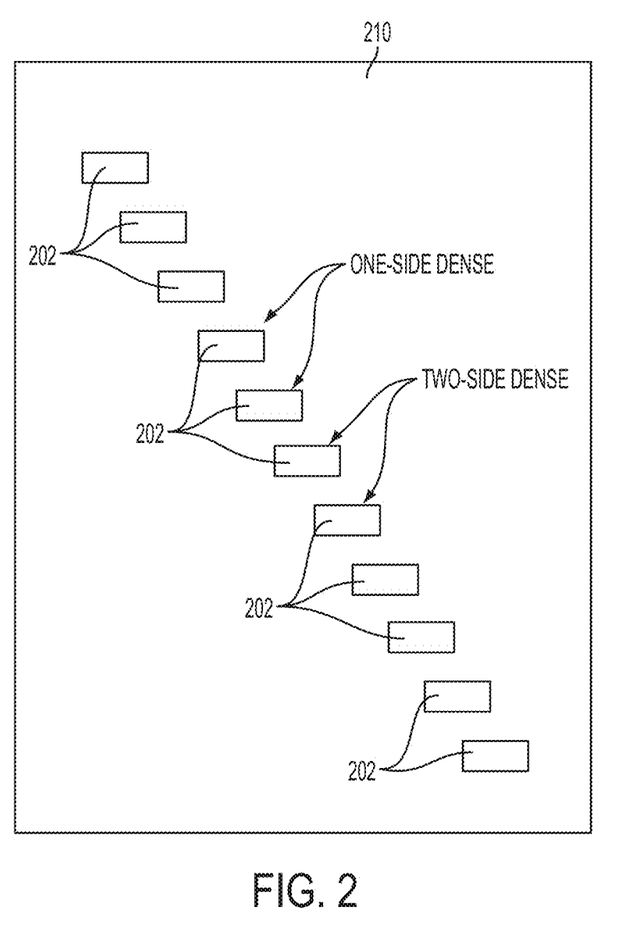
FIG. 2 illustrates a mask design according to an embodiment of the invention.
Figure 3:
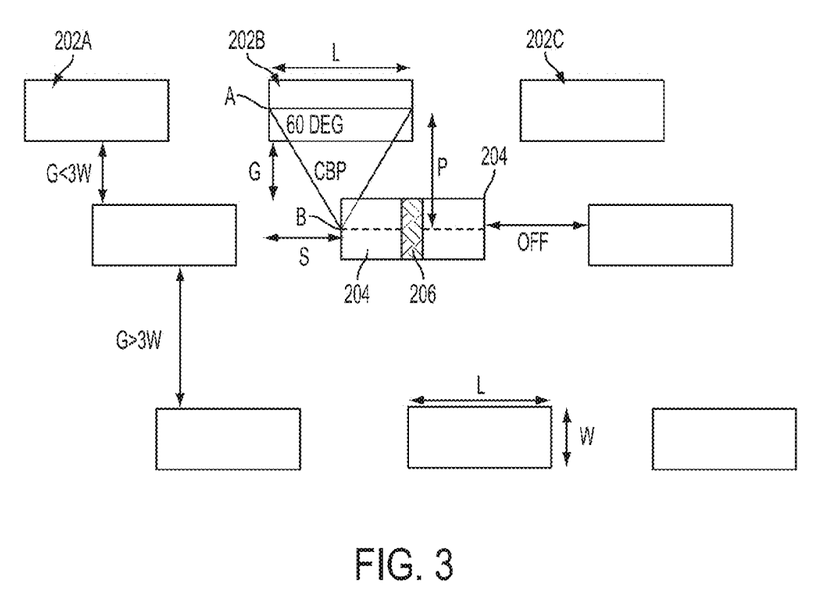
FIG. 3 is a schematic illustration of the features of the mask illustrated in FIG. 2.

The inventors have realized that with a suitable mask design, it is possible to take advantage of the optical proximity effect and use dipole illumination to produce 2D features with a pitch less than 100 nm. FIG. 2 illustrates a photolithographic mask 210 according to an embodiment of the invention. In this embodiment, the substantially opaque mask 210 includes a series of substantially transparent mask features 202 which are both one-side dense and two-side dense as illustrated in more detail in FIG. 3. The rectangular mask features 202 are arrayed such that the each successive rectangular mask features 202 is shifted a distance S from the preceding rectangular mask features 202. This results in portions 206 of features 202 that are two-side dense and portions 204 of features 202 which are one-side dense. In this embodiment, the two-side dense portions 206 are located in the middle of the mask features and the one-side dense portions 204 are located to the left and right sides of the two-side dense portions in the rectangular mask feature 202 because the middle portions 206 of each feature 202 are shielded on two sides by adjacent features 202 above and below it, while the side or edge portions 204 (in the longer length "L" direction of each feature 202) are shielded by only one adjacent feature 202 above or below it. For example, as shown in FIG. 3, each left side or edge one-side dense portion 204 is shielded from above by an adjacent feature 202 while each right side or edge one-side dense portion 204 is shielded from below by another adjacent feature 202. As discussed in more detail below, the mask 210 with mask features 202 yields an array of two dimensional features in a photoresist which are generally circular or elliptically shaped.

In the embodiment illustrated in FIG. 2, the mask features 202 are rectangles. The shape of the mask features 202, however, is not limited to rectangles. The mask feature 202 may have any shape, including irregular shapes, as long the mask features 202, as arrayed on the mask 210, include portions that are one-side dense and portions that are two-side dense.

Parameters which may be used to characterize the design of a photographic mask 210 according to embodiments of the invention are schematically illustrated in FIG. 3. Mask 210 includes three offset columns or series of mask features 202A, 202B, 202C. The columns or series of mask features 202A, 202B, 202C are offset from each other by a distance OFF. The mask features 202 are substantially rectangular with a length L and a width W. Each mask feature 202 in a series of mask features 202A, 202B, 202C is separated vertically from the next mask feature 202 in the same series 202A, 202B, 202C by a gap G. Further, as discussed above, each subsequent mask feature 202 is shifted in the horizontal direction from the previous mask feature 202 by a distance S. The pitch P is defined as the distance measured from centerline to centerline of successive mask features 202 in a series of mask features 202A, 202B, 202C.

Also illustrated in FIG. 3 is the CB pitch CBP. The CB pitch CBP connects a first point located at an intersection of the centerline of a first mask feature 202 and a first short side of the first mask feature 202 with a corresponding second point located at an intersection of the centerline of a successive mask feature 202 and a corresponding first short side of the successive mask feature 202. In the embodiment illustrated in FIG. 3, the CB pitch CBP has been selected to be equal to the length L of the mask feature 202. The result of setting the CB pitch CBP equal to the length L of the mask feature 202 is illustrated in FIG. 3 as an equilateral triangle in which the angle between CB pitch CBP and centerline of is 60 degrees. In alternative embodiments, the CB pitch CBP may be longer or shorter than the length L of the mask feature 202. The resulting angle between the centerline and the CB pitch CBP, therefore, need not be 60 degrees. The angle may, for example, range from 55 to 70 degrees, such as from 57 to 68 degrees.

As illustrated in FIG. 2, the mask 210 only includes a single series of mask features 202. However, as illustrated in FIG. 3 additional series of mask features 202B, 202C may be provided on mask 210. As illustrated in FIG. 3, the additional series of mask features 202B, 202C are identical to the first series of mask features 202A. This, however, is not necessary. In alternative embodiments, the additional series of mask features 202B, 202C may include mask features that are smaller, larger, or even differently shaped than the first mask features. Further, the mask 210 need not be limited to three series of mask features 202A, 202B, 202C. Indeed, the mask 210 may have 2 or more, such as hundreds or thousands (e.g., 10-100,000) of series of mask features 202.

Figure 4:
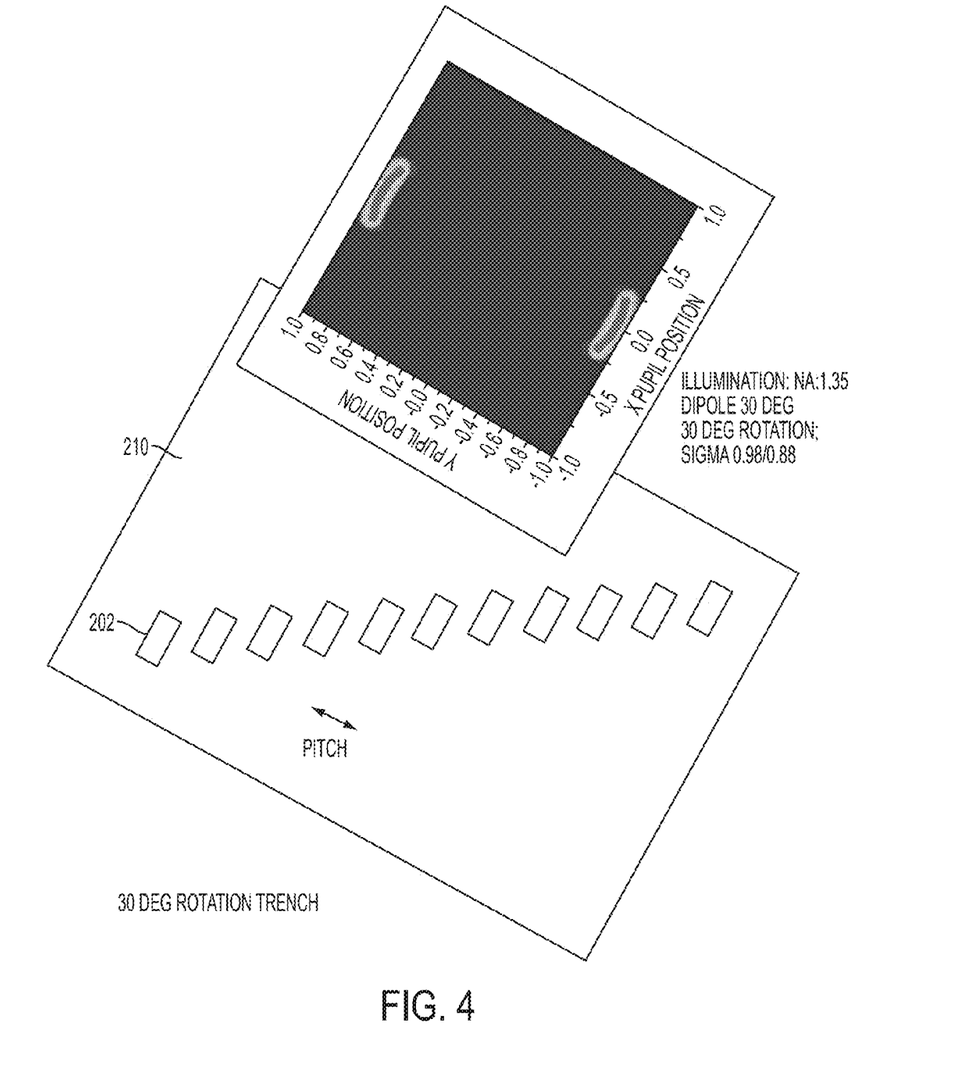
FIG. 4 illustrates a mask design according to another embodiment of the invention.

FIG. 4 illustrates an alternative embodiment of a mask 210. In this embodiment, the mask 210 is rotated relative to the embodiment illustrated in FIG. 2 so that a series of 2D features 202 are produced in an underlying photoresist layer 12 which are oriented substantially horizontally in the underlying photoresist layer 12. In an embodiment, the rotation is substantially 30 degrees. For example, the mask 210 may be configured to be positioned at an angle ranging from 25 to 35 degrees with respect to an imaginary horizontal line in a photolithography exposure tool. Other rotations, greater or lesser, may however be selected as desired. In this manner, rows of 2D features 14 in the photoresist layer 12 from horizontal to vertical or any angle in between may be produced.

In an embodiment, the mask 210 is a photolithography mask that includes a plurality of mask features 202 configured to pattern features of a NAND device. Possible NAND features include, but are not limited to, via holes used for NAND contacts and/or interconnects. Typically, all of the adjacent mask features 202 in a series are separated by a gap G and are offset from other series of mask features 202 by a distance OFF such that individual mask all of the mask features 202 have one-side dense portions and two-side dense portions. In alternative embodiments, however, one or more mask features 202 may not have both one-side dense and two-side dense portions.

In an embodiment, the individual mask features 202 have a characteristic length and for the one-side dense portions the nearest adjacent mask feature is more than 3 characteristic lengths distant. For the two-side dense portions, the nearest adjacent mask feature is less than 3 characteristic lengths distant. The individual mask features may be rectangular with longer sides (the length) oriented in a first direction and shorter sides (the width) oriented in a second direction perpendicular to the first direction. The characteristic length may be, for example, equal to the span (width) of the shorter side of the rectangle.

In an embodiment, the plurality of mask features 202 includes one or more stepped rows of offset rectangular mask features 202 in which all of the gaps G and all of the offsets OFF between adjacent mask features 202 are substantially the same. The one-side dense portions 204 are located in two opposing sides or edges (see FIG. 3) of each mask feature 202 which are shifted or offset with respect to an adjacent mask feature, while the two-side dense portions 206 are located in the middle between the one-side dense portions 204, such that the portions 206 are shielded from above and below by adjacent features 202 separated by distance G.

In an embodiment shown in FIG. 3, the distance measured orthogonally from a first mask feature centerline oriented in the first direction to an adjacent second mask feature centerline oriented in the first direction defines a pitch ("P"), and the pitch is between 60 and 80 nm In an embodiment, the angle between a first point, A, located at an intersection of the first mask feature centerline and a first shorter side of the first mask feature with a corresponding second point, B, located at an intersection of the second mask feature centerline and a corresponding first shorter side of the second mask feature ranges from 55 to 70 degrees, such as 57 to 68 degrees. In an embodiment, the CB pitch line CBP connects the first point A to the second point B and the CB pitch line length ranges from 70 to 90 nm.

In an embodiment, the length of the longer sides (L) of the mask features ranges from 63 to 73 nm while the length of the shorter sides (W) of the mask features 202 ranges from 33 to 43 nm. In this embodiment, the offset OFF between adjacent mask features 202 ranges from 120 to 180 nm and the gap G between adjacent mask features 202 is greater than 30 nm. Additionally, the mask features 202 may be arrayed such that the each successive rectangular mask features 202 is shifted a distance (S) from the preceding rectangular mask features 202. The distance S may be, for example 30-70 nm.

In an embodiment, the mask 210 may be square or rectangular, and includes a stepped row of offset mask features 202 that extends along an imaginary line which is oriented at an angle ranging from 25 to 35 degrees to a side of the mask 210, as shown in FIG. 4. The mask 210 may be configured to be positioned at an angle ranging from 25 to 35 degrees with respect to an imaginary horizontal line in a photolithography exposure tool.

In an embodiment, as noted above, the mask 210 may be a substantially opaque phase shift mask which includes a plurality of mask features 202 which are substantially transparent.

Embodiments of the invention also include methods of performing photolithography. An embodiment of the method includes the step of providing a substantially opaque mask 210 having N stepped rows of offset and substantially transparent, rectangular mask features 202. In this embodiment, N is an integer and N≧2. The method also includes a step of illuminating with dipole illumination a photoresist layer 12 located over an underlying material through the substantially transparent, rectangular mask features 202 in the substantially opaque mask 210 to form 2N rows of exposed regions 14 in the photoresist layer 12. In this embodiment, the exposed regions 14 have a substantially elliptical or substantially circular shape when viewed from above the photoresist layer 12. A substantially elliptical or substantially circular shape is one in which the radius of curvature and/or the eccentricity varies by less than 10%. It also includes shapes whose circumference is smooth or rough.

Further, in this embodiment, adjacent mask features 202 in each row of offset, substantially transparent, rectangular mask features 202 are separated by a gap G and are offset from each other such that individual mask features 202 have one-side dense portions 204 and two-side dense portions 206. This embodiment includes providing a mask 210 having a plurality of mask features 202 in which adjacent mask features 202 are separated by a gap G and are offset from each other such that individual mask features 202 have one-side dense portions 204 and two-side dense portions 206. The method also includes illuminating a photoresist layer 12 located over an underlying material with dipole illumination through the plurality of mask features 202 in the mask 210 to form exposed regions 14 in the photoresist layer 12. Thus, 2D features (e.g. 2 rows of holes) 14 can be generated in the photoresist layer 12 using a 1D mask layout (one row of rectangular features 202).

In an embodiment, use of the mask results in a pitch between the exposed regions in the underlying photoresist layer 12 in each of the 2N rows that ranges from 70 to 85 nm. In an embodiment, the angle between the centerline of the mask features 202 and the CB pitch CBP ranges from 57 to 68 degrees. The CB pitch is an imaginary line whose length ranges from 70 to 90 nm.

In another embodiment of the method, the length of the longer sides L of the mask features 202 ranges from 63 to 73 nm and the length of the shorter sides W of the mask features ranges from 33 to 43 nm. Exposure of an underlying photoresist layer 12 with this mask results in exposed regions that have a substantially elliptical shape of approximately 30 to 50 nm in length and 15 to 25 nm in width or a substantially circular shape approximately 15-25 nm in radius. In this embodiment, the offset OFF between adjacent mask features 202 ranges from 30 to 45 nm and the gap G between adjacent mask features is greater than 30 nm.

In another embodiment of the method, the mask 210 comprises a square or rectangular mask 210 which is rotated at an angle ranging from 25 to 35 degrees with respect to an imaginary horizontal line in a photolithography exposure tool, such that the N stepped rows of offset mask features 202 extend along an imaginary line which is oriented substantially parallel to the imaginary horizontal line and at an angle ranging from 25 to 35 degrees to a side of the mask 210.

Figure 10A:
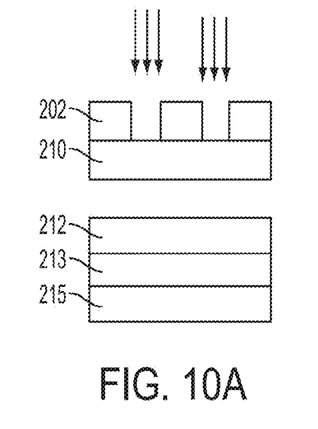
FIGS. 10A-10C are schematic illustrations of steps in a method of making a semiconductor device according to an embodiment.
Figure 10B:
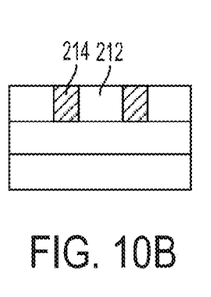
Figure 10C:
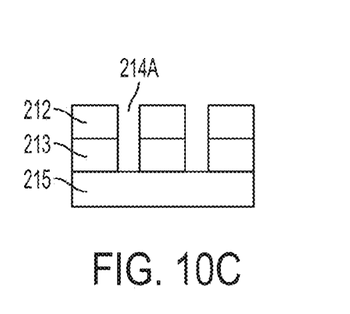

FIGS. 10A-C illustrate a method of making a semiconductor device according to an embodiment. In this embodiment, a partially completed device 215, such as a NAND, includes a top layer 213, such as an insulating layer (e.g., silicon oxide, silicon nitride, organic dielectric, etc.), to be patterned. The pattern in the top layer 213 may include vias which may be filled with a conducting material to interconnect or contact individual transistors in the NAND string. Other pattern features for other purposes may also be made by this method. A layer 212 of positive photoresist is deposited on top of the top layer 213.

Deep UV radiation, indicated by the arrows, is focused on the mask 210. The substantially opaque features 202 on the mask 210 block the light while the substantially transparent mask 210 allows light to pass through to the layer 210 of positive photoresist. Portions 214 of the photoresist layer 210 exposed to the light are developed. The exposed portions 214 of the photoresist layer 212 may be selectively removed to expose portions of the underlying top layer 213 in openings 214A in the photoresist. The unexposed portions 212 may be used as a mask while removing (i.e., etching) the exposed portions of the underlying top layer 213. In this manner 2N rows of openings 214A in the underlying top layer 213 may be formed. The remaining photoresist 212 is then removed.

Figure 12:
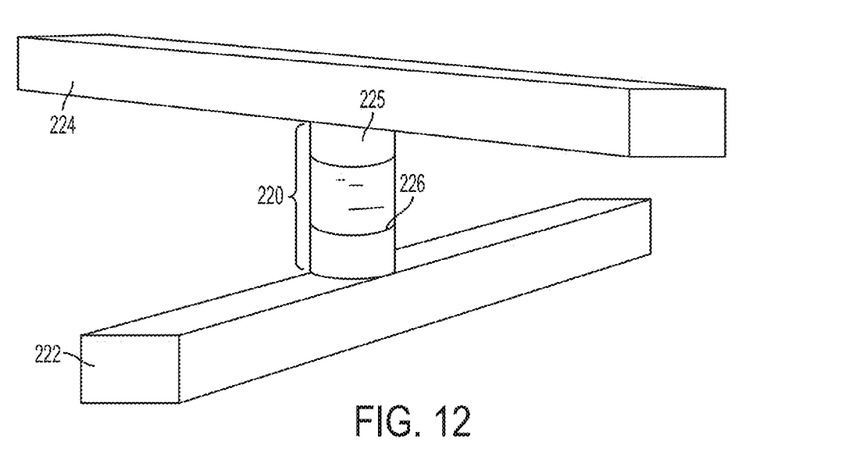
FIG. 12 is a schematic illustration of a memory cell made by the method illustrated in FIGS. 11A-C.
Figure 13A:
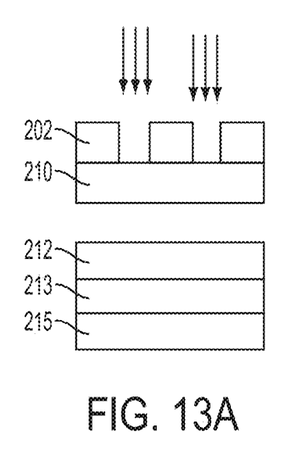
Figure 13B:
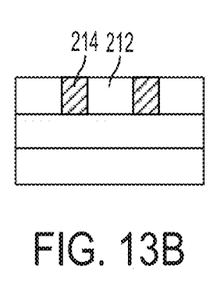
Figure 13C:
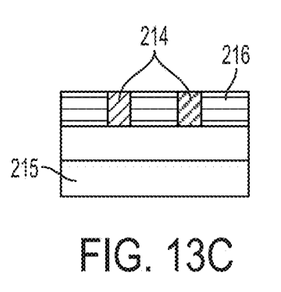
Figure 13D:
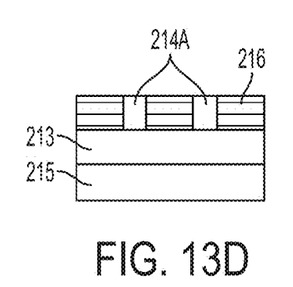
Figure 13E:
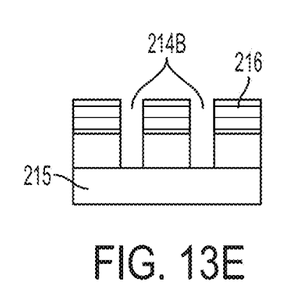

In the above embodiment, the underlying top layer 213 may comprise an insulating layer located over a NAND memory device and the 2N rows of openings 214A may comprise contact openings to the NAND memory device. Alternatively as illustrated in FIG. 12, the underlying top layer 213 may comprise an insulating layer located over a substrate and the 2N rows of openings 214 comprise 2N rows openings in the insulating layer in which 2N rows of damascene pillar shaped memory cells 220 comprising a semiconductor steering element 226 and a storage element 225 are formed. One end of the damascene pillar shaped memory cells 220 may be electrically connected to a bit line 222, while an opposite end may be connected to a word line 224 (or vise-versa). Such a ReRAM non-volatile memory device is described, for example, in U.S. Pat. No. 7,746,680 which is incorporated herein by reference in its entirety.

Figure 11A:
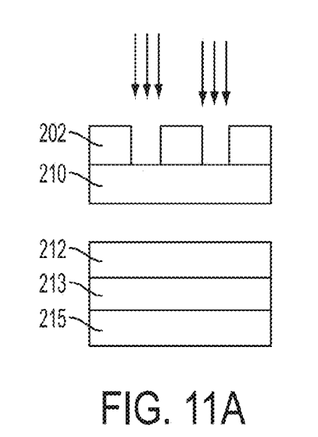
FIGS. 11A-11C and 13A-13E are schematic illustrations of steps in methods of making a semiconductor device according to two respective, alternative embodiments.
Figure 11B:
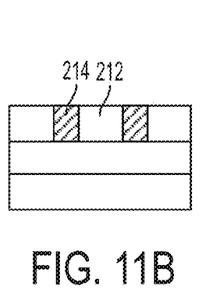
Figure 11C:
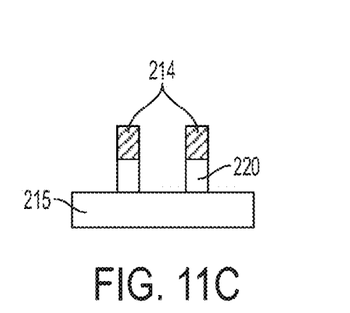

In another embodiment illustrated in FIGS. 11A-11C, the method includes developing the exposed photoresist layer 214, in which the photoresist layer comprises a negative photoresist. In this method, the unexposed portions 212 of the photoresist layer 212 are removed, leaving pillar shaped exposed regions 214 of developed photoresist layer 212. The pillar shaped exposed regions 214 are used as a mask while selectively etching the underlying top layer 213, thereby forming 2N rows of pillars 220 in the underlying top layer 213. The exposed portion 214 of photoresist material 212 is then removed.

In the above embodiment, as in the previous embodiment, the underlying top layer 213 may comprise at least one semiconductor layer and the 2N rows of pillars comprise 2N rows of pillar shaped memory cells 220 comprising a semiconductor steering element 226 and a storage element 225 of the ReRAM non-volatile memory device.

In another embodiment illustrated in FIGS. 13A-13E, the method further includes developing the exposed photoresist layer 212, in which the photoresist layer comprises a negative photoresist. The method also includes removing unexposed portions of the photoresist layer 212 to leave pillar shaped exposed regions 214 of the developed photoresist layer 212. The method also includes depositing a blocking material layer 216 (e.g., a low temperature oxide or an organic spin on material) around the pillar shaped exposed photoresist regions 214 and removing the pillar shaped exposed photoresist regions 214 to expose portions of the underlying material in openings 214A in the blocking material layer 216. The method also includes a step of removing the portions of the underlying material 213 exposed in openings 214A, thereby forming 2N rows of openings 214B in the underlying material 213. The openings can be filled with NAND contacts or ReRAM pillar devices.

EXAMPLES

FIGS. 5-9 illustrate simulated exposure patterns resulting from use of photolithographic masks 210 and methods of the invention shown in FIG. 4. In FIGS. 5-8, the simulations were conducted based on (A) the dipole illumination being in focus and (B) the dipole illumination being 50 nm out of focus. The simulation with out of focus dipole illumination was conducted to determine the sensitivity of the methods to the focus of the dipole illumination. Example illumination parameters include: a numerical aperture ("NA") of 1.35, a dipole angle of 50°, a rotation trench of 26-27°, a partial coherence ("sigma") of $\sigma_{out}$=0.98, $\sigma_{in}$=0.92 and feature critical dimensions ("CD") of 38/68 nm.

The numerical aperture is a dimensionless number that characterizes the range of angles over which the system can accept or emit light. The higher the numerical aperture, the smaller the pitch that can be produced. For example, a numerical aperture of 1.35 may be achieved with immersion lithography. As illustrated in FIG. 4, use of a numerical aperture of 1.35 and large units of partial coherence ($\sigma_{in}$=0.88, $\sigma_{out}$=0.98) results in a very narrow radiation beam passing through the mask 210.

Figure 5A:
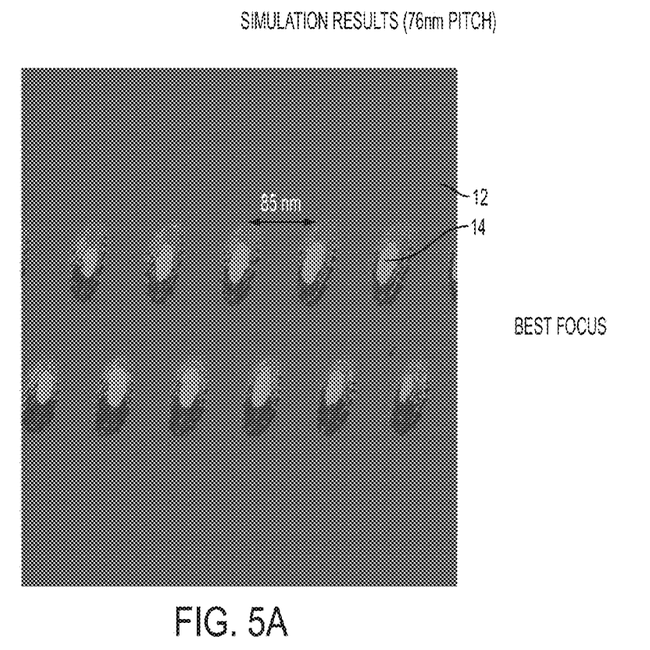
FIG. 5A illustrates simulated results of exposure through a 76 nm pitch mask according to an embodiment of a method of the invention under "best focus" conditions and FIG. 5B illustrates simulated results under 50 nm defocus conditions.
Figure 5B:
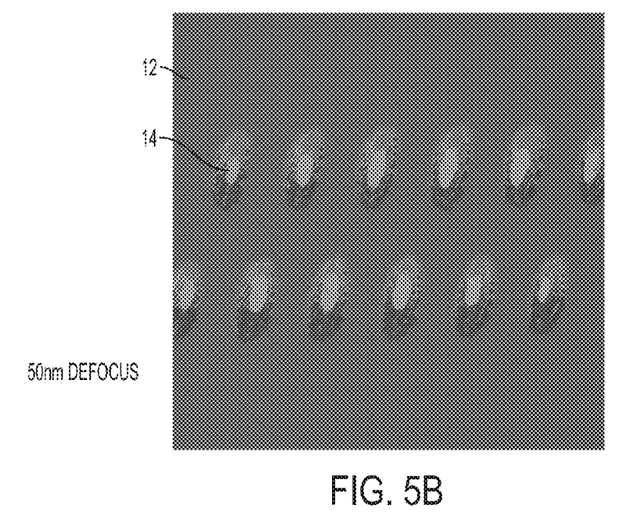

FIG. 5 illustrates (A) simulated results of exposure through a 76 nm pitch mask according to an embodiment of a method of the invention under "best focus" conditions and (B) under 50 nm defocus conditions. As can be seen in the simulations, the exposure pattern includes exposed regions 14 that have a substantially elliptical shape. Further, the exposure pattern has an 85 nm CB pitch. That is, a mask 210 with rectangular features 202 having a 76 nm pitch results in exposure pattern having elliptical exposed regions 14 with an 85 nm CB pitch. Defocusing the dipole illumination had no discernable effect on the exposure pattern.

Figure 6A:
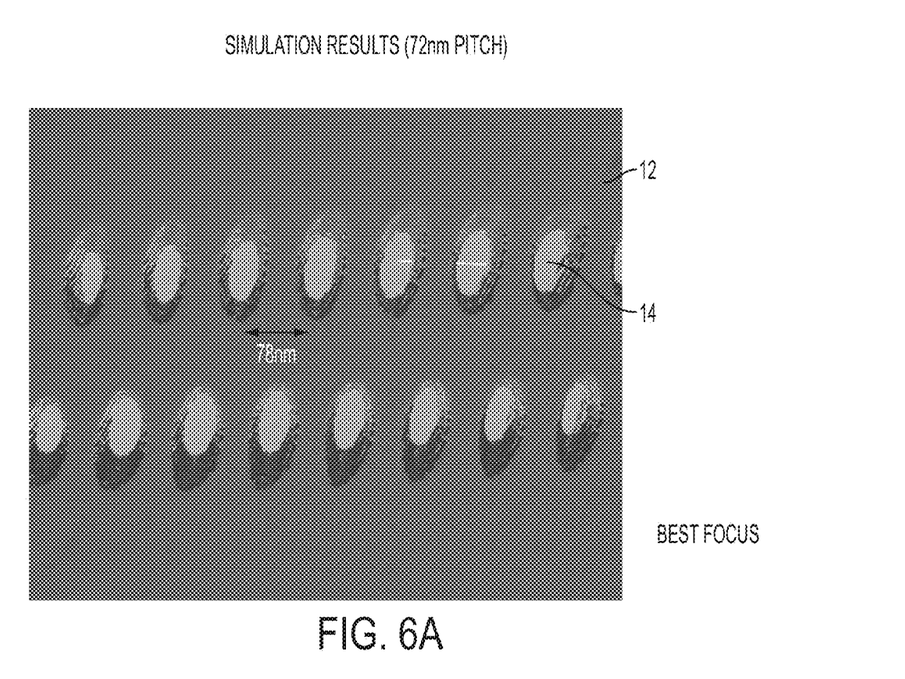
FIG. 6A illustrates simulated results of exposure through a 72 nm pitch mask according to an embodiment of a method of the invention under "best focus" conditions and FIG. 6B illustrates simulated results under 50 nm defocus conditions.
Figure 6B:
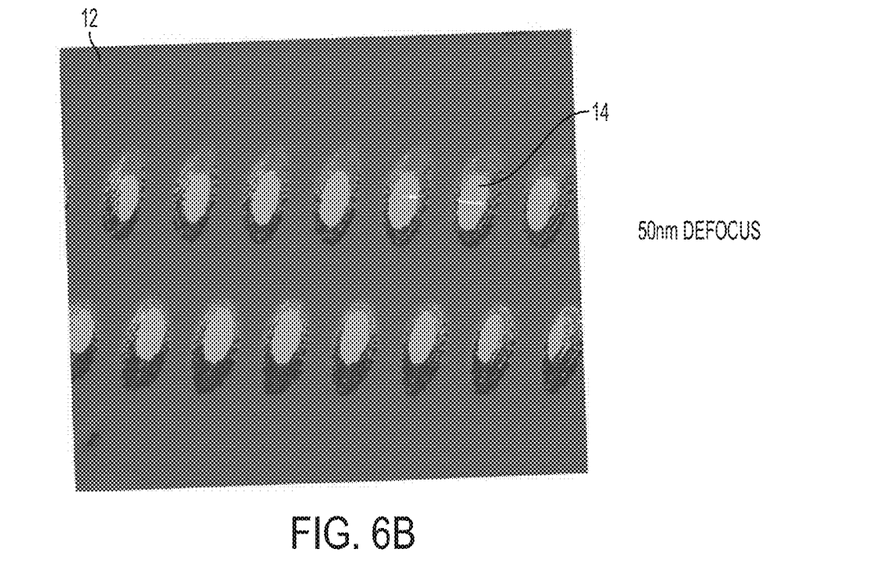

FIG. 6 illustrates (A) simulated results of exposure through a 72 nm pitch mask according to an embodiment of a method of the invention under "best focus" conditions and (B) under 50 nm defocus conditions. As in the previous embodiment, the exposed regions 14 have an elliptical shape. The exposure pattern of this embodiment has a CB pitch of 78 nm.

Figure 7A:
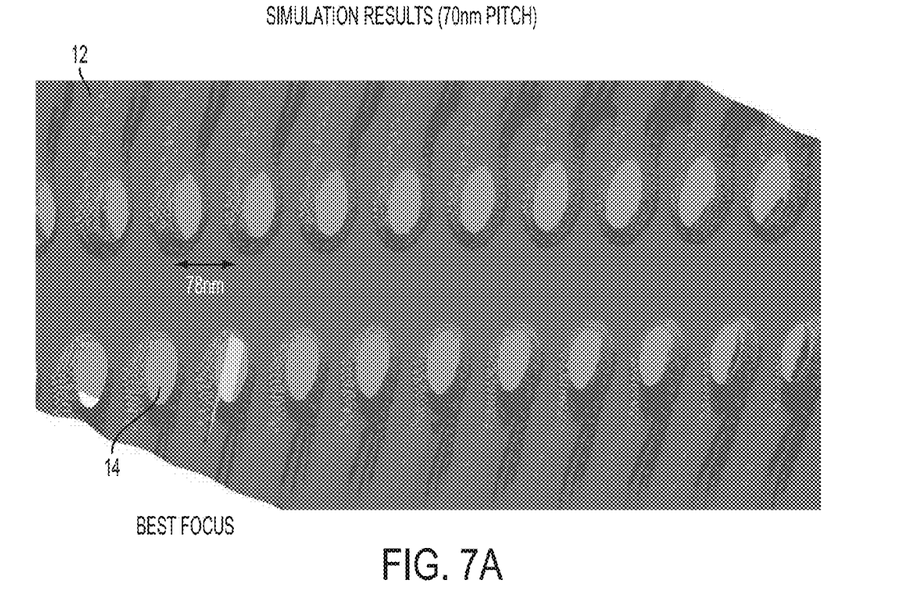
FIG. 7A illustrates simulated results of exposure through a 70 nm pitch mask according to an embodiment of a method of the invention under "best focus" conditions and FIG. 7B illustrates simulated results under 50 nm defocus conditions.
Figure 7B:
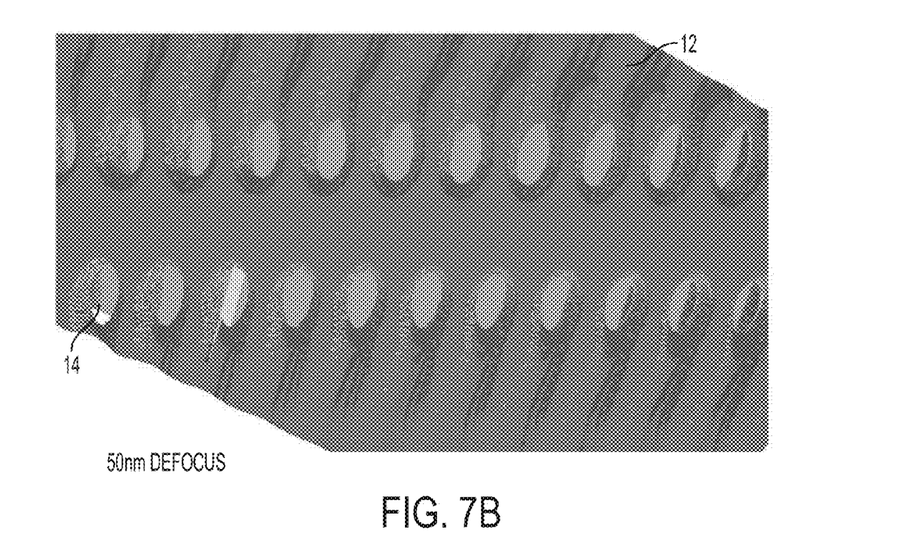

FIG. 7 illustrates (A) simulated results of exposure through a 70 nm pitch mask according to an embodiment of a method of the invention under "best focus" conditions and (B) under 50 nm defocus conditions. As in the previous embodiments, the exposed regions 14 have a substantially elliptical shape. In this embodiment, the exposure pattern has a CB pitch of 78 nm. As in the previous embodiments, defocusing the dipole illumination has no effect on the exposure pattern.

Figure 8A:
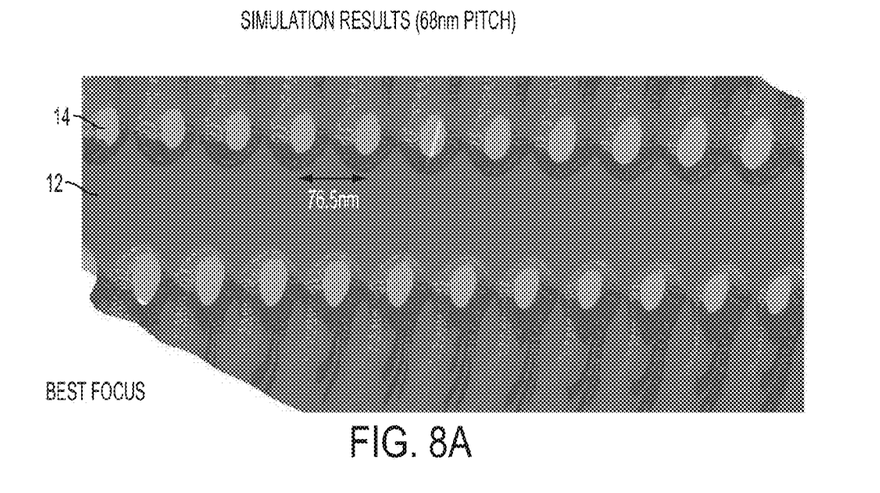
FIG. 8A illustrates simulated results of exposure through a 68 nm pitch mask according to an embodiment of a method of the invention under "best focus" conditions and FIG. 8B illustrates simulated results under 50 nm defocus conditions.
Figure 8B:
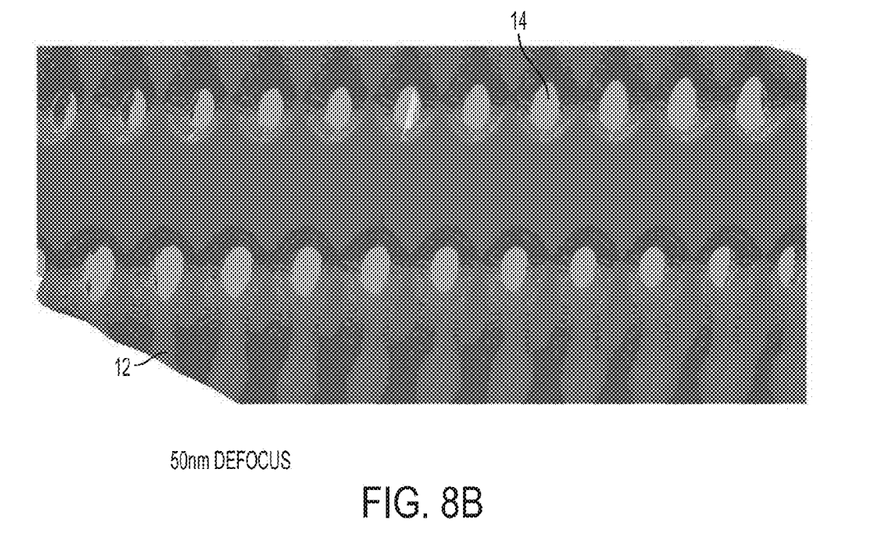

FIG. 8 illustrates (A) simulated results of exposure through a 68 nm pitch mask according to an embodiment of a method of the invention under "best focus" conditions and (B) under 50 nm defocus conditions. Exposure through this mask 210 results in a exposure pattern with elliptical exposed regions 14 with a CB pitch of 76.5 nm. Defocusing the dipole illumination has no substantial effect on the exposure pattern, but some CD variation was observed.

Figure 9:
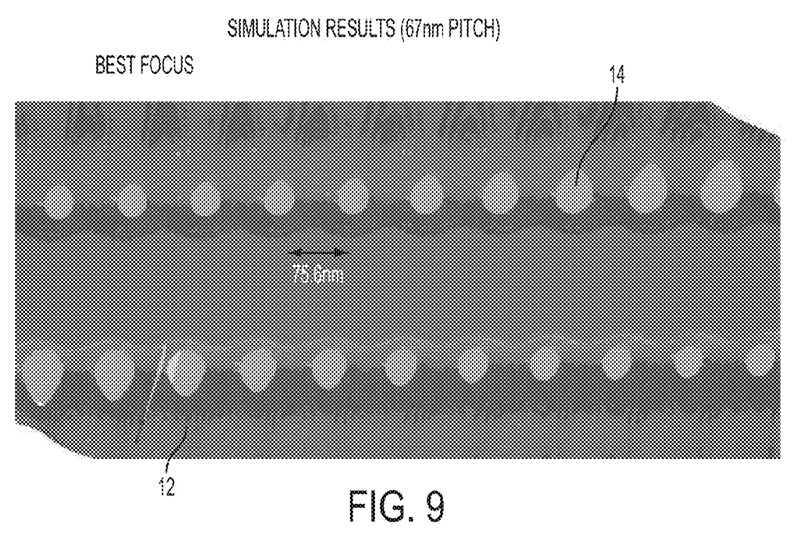
FIG. 9 illustrates simulated results of exposure through a 67 nm pitch mask according to an embodiment of a method of the invention under "best focus" conditions.

FIG. 9 illustrates simulated results of exposure through a 67 nm pitch mask according to an embodiment of a method of the invention under "best focus" conditions. Exposure through this mask results in a exposure pattern with elliptical exposed regions 14 with a CB pitch of 75.6 nm. Large CD variation was observed.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A photolithography method, comprising:
providing a substantially opaque mask having N stepped rows of offset, substantially transparent, rectangular mask features, where N is an integer and N≧2; and
illuminating a photoresist layer located over an underlying material layer with dipole illumination through the substantially transparent, rectangular mask features of the substantially opaque mask to form 2N rows of exposed regions in the photoresist layer;
wherein the exposed regions have a substantially elliptical or a substantially circular shape when viewed from above the photoresist layer;
wherein:
adjacent rectangular mask features in each row of the offset, substantially transparent, rectangular mask features are separated by a gap and the rectangular mask features are offset from each other such that individual mask features have one-side dense portions and two-side dense portions;
each of the rectangular individual mask features has a characteristic length which corresponds to a shorter side length for each of the individual mask features;
for the one-side dense portions, a nearest adjacent mask feature is more than 3 characteristic lengths distant;
for the two-side dense portions, a nearest adjacent mask feature is less than 3 characteristic lengths distant;
the individual rectangular mask features comprise longer sides oriented in a first direction and shorter sides oriented in a second direction perpendicular to the first direction;
the gap is measured between the longer sides of adjacent mask features;
the offset is measured as an orthogonal displacement of shorter sides of adjacent mask features in the first direction;
each gap and each offset are substantially the same in between adjacent mask features in the N stepped rows of offset rectangular mask features;
the one-side dense portions are located at two opposing shorter sides of each mask feature, which is offset with respect to an adjacent mask feature;
the two-side dense portions are located in between the two one-side dense portions;
a distance measured orthogonally from a first mask feature centerline oriented in the first direction to an adjacent second mask feature centerline oriented in the first direction defines a pitch, and the pitch is between 60 and 80 nm;
an angle, in between a first point located at an intersection of the first mask feature centerline and a first shorter side of a first mask feature with a corresponding second point located at an intersection of the second mask feature centerline and a corresponding first shorter side of a second mask feature, ranges from 55 to 70 degrees; and
a pitch, in between the exposed regions in the photoresist layer in each of the 2N rows, ranges from 70 to 85 nm.

2. The method of claim 1, wherein:
the angle ranges from 57 to 68 degrees;
a CB pitch imaginary line connects the first point to the second point; and
the CB pitch imaginary line has a length ranges that from 70 to 90 nm.

3. The method of claim 1, wherein:
a first length of each of the longer sides of the mask features ranges from 63 to 73 nm;
a second length of each of the shorter sides of the mask features ranges from 33 to 43 nm;
the exposed regions have the substantially elliptical shape of approximately 30 to 50 nm in length and 15 to 25 nm in width or the substantially circular shape of approximately 15 to 25 nm in radius;
the offset between adjacent mask features ranges from 30 to 70 nm; and
the gap between adjacent mask features is greater than 30 nm.

4. The method of claim 1, wherein the substantially opaque mask comprises a square or rectangular mask which is rotated at an angle ranging from 25 to 35 degrees with respect to an imaginary horizontal line in a photolithography exposure tool, such that the N stepped rows of offset mask features extend along an imaginary line which is oriented substantially parallel to the imaginary horizontal line and at an angle ranging from 25 to 35 degrees to a side of the substantially opaque mask.

5. The method of claim 1, further comprising:
developing the exposed photoresist layer, wherein the photoresist layer comprises a negative photoresist;
removing unexposed portions of the photoresist layer to leave pillar shaped exposed regions of the developed photoresist layer; and
depositing a blocking material layer around the pillar shaped exposed photoresist regions;
removing the pillar shaped exposed photoresist regions to uncover portions of the underlying material layer in openings in the blocking material layer; and
removing the uncovered portions of the underlying material layer, thereby forming 2N rows of openings in the underlying material layer.

6. The method of claim 1, further comprising:
developing the exposed photoresist layer, wherein the photoresist layer comprises a negative photoresist;
removing unexposed portions of the photoresist layer to leave pillar shaped exposed regions of the developed photoresist layer; and
removing portions of the underlying material layer that are not covered by the pillar shaped exposed photoresist regions, thereby forming 2N rows of pillars in the underlying material layer.

7. The method of claim 6, where the underlying material layer comprises at least one semiconductor layer, and the 2N rows of pillars comprise 2N rows of pillar shaped memory cells, each comprising a semiconductor steering element and a storage element.

8. The method of claim 1, further comprising:
developing the exposed photoresist layer, wherein the photoresist layer comprises a positive photoresist;
removing the exposed regions in the developed photoresist layer to uncover portions of the underlying material layer; and
removing the uncovered portions of the underlying material layer, thereby forming 2N rows of openings in the underlying material layer.

9. The method of claim 8, wherein:
the underlying material layer comprises an insulating layer located over a NAND memory device; and
the 2N rows of openings comprise contact openings to the NAND memory device.

10. The method of claim 8, wherein:
the underlying material layer comprises an insulating layer located over a substrate; and
the 2N rows of openings comprise 2N rows of openings in the insulating layer in which 2N rows of damascene pillar shaped memory cells, each comprising a semiconductor steering element and a storage element, are formed.

* * * * *